United States Patent
Noda

[19]

[11] Patent Number: 6,132,226

[45] Date of Patent: Oct. 17, 2000

[54] STRUCTURE AND METHOD FOR MOUNTING AN ELECTRONIC PART

[75] Inventor: Yuji Noda, Tokyo, Japan

[73] Assignee: NEC Corporation, Tokyo, Japan

[21] Appl. No.: 09/190,011

[22] Filed: Nov. 12, 1998

[30] Foreign Application Priority Data

Nov. 18, 1997 [JP] Japan ................................. 9-317244

[51] Int. Cl.[7] .................................................. H01R 4/58
[52] U.S. Cl. .......................................................... 439/91
[58] Field of Search ............................. 439/91, 66, 591; 29/877; 257/693

[56] References Cited

U.S. PATENT DOCUMENTS

| | | | |
|---|---|---|---|
| 3,591,839 | 7/1971 | Evans ........................................ | 257/684 |
| 4,449,774 | 5/1984 | Takashi et al. ........................... | 439/590 |
| 4,509,099 | 4/1985 | Takamatsu ............................ | 439/66 X |
| 4,642,889 | 2/1987 | Grabbe ................................... | 439/74 X |
| 4,664,309 | 5/1987 | Allen et al. .......................... | 228/180.22 |
| 4,667,219 | 5/1987 | Lee et al. ................................ | 257/693 |
| 5,109,320 | 4/1992 | Bourdelaise et al. . | |
| 5,162,613 | 11/1992 | Schoenthaler ........................ | 439/66 X |
| 5,342,999 | 8/1994 | Frei et al. . | |
| 5,735,698 | 4/1998 | Bakker et al. ............................ | 439/91 |
| 5,819,406 | 10/1998 | Yoshizawa et al. ...................... | 29/877 |
| 5,905,638 | 5/1999 | MacDonald, Jr. et al. ........... | 439/66 X |

FOREIGN PATENT DOCUMENTS

| | | |
|---|---|---|
| 0327399 A1 | 8/1989 | European Pat. Off. . |
| 0451363 A1 | 10/1991 | European Pat. Off. . |
| 54-177974 | 12/1979 | Japan . |
| 60-31043 | 2/1985 | Japan . |
| 61-86968 | 6/1986 | Japan . |
| 7-60884 | 6/1995 | Japan . |
| 8-78474 | 3/1996 | Japan . |
| 8-340164 | 12/1996 | Japan . |
| 1341037 | 12/1973 | United Kingdom . |
| 2222327 | 2/1990 | United Kingdom . |
| 2262384 | 6/1993 | United Kingdom . |

OTHER PUBLICATIONS

Japanese Office Action, dated Jan. 18, 2000, with English language translation of Japanese Examiner's comments.

*Primary Examiner*—Neil Abrams
*Assistant Examiner*—Son V. Nguyen
*Attorney, Agent, or Firm*—Whitham, Curtis & Whitham

[57] ABSTRACT

A structure for mounting a semiconductor device or similar electronic part to a printed circuit board and a method therefor are disclosed. Electrodes are formed on the front of the circuit board while electrodes are formed on the electronic part. The circuit board and electronic part are affixed to each other by adhesive while holding thin metallic wires between their electrodes.

28 Claims, 6 Drawing Sheets

STRUCTURE AND METHOD FOR MOUNTING AN ELECTRONIC PART

BACKGROUND OF THE INVENTION

The present invention relates to a structure and a method for mounting a semiconductor device or similar electronic part to the surface of a printed circuit board.

A structure for mounting a semiconductor device is disclosed in, e.g., Japanese Patent Laid-Open Publication No. 8-78474. The structure taught in this document includes a printed circuit board and a chip size package (CSP) or electronic part mounted on the surface of the circuit board. A CSP refers to a semiconductor package having substantially the same size as a semiconductor chip. The circuit board has electrode portions connected to the electrode portions of the CSP by solder bumps. Insulative adhesive fills a gap between the circuit board and the CSP.

However, a problem with the above conventional structure is that bubbles are apt to enter the adhesive when the adhesive is caused to flow into the small gap between the circuit board and the CSP, degrading the firm connection between the circuit board and the CSP. Filling the adhesive without introducing bubbles is particularly difficult when the CSP has a broad area.

Further, the circuit board and CSP have their electrodes connected together by the solder bumps, and the solder bumps are covered with the insulative adhesive. This brings about another problem that at the time of replacement of the CSP, it is difficult to remove the solder bumps and adhesive from the CSP removed from the circuit board and the circuit board. Moreover, to mount a new CSP to the circuit board, there must be repeated the steps of forming solder bumps and filling insulative adhesive. As a result, the replacement of the CSP mounted on the printed circuit board is time- and labor-consuming.

SUMMARY OF THE INVENTION

It is therefore an object of the present invention to provide a structure and a method capable of mounting an electronic part to a printed circuit board with a minimum of defective connection ascribable to a difference in the coefficient of thermal expansion between the circuit board and the electronic part.

It is another object of the present invention to provide a structure and a method promoting easy replacement of an electronic part mounted on a printed circuit board.

In accordance with the present invention, a structure for mounting an electronic part includes a printed circuit board formed with electrodes on its front thereof. An electronic part to be mounted to the front of the printed circuit board is formed with electrodes to be connected to the electrodes of the printed circuit board. Conduction members are held between the electrodes of the printed circuit board and the electrodes of the electronic part for setting up electrical connection between them.

Also, in accordance with the present invention, a method of mounting an electronic part to a printed circuit board begins with the step of positioning the printed circuit board formed with electrodes on its front and the electronic part formed with electrodes to be connected to the electrodes of the printed circuit board such that the electrodes of the printed circuit board and the electrodes of the electronic part align with each other. Conduction members are positioned on the electrodes of the printed circuit board for electrically connecting the electrode and the electrodes of the electronic part. The electronic part is pressed against the printed circuit board. The electronic part is affixed to the printed circuit board while being pressed against the printed circuit board.

BRIEF DESCRIPTION OF THE DRAWINGS

The above and other objects, features and advantages of the present invention will become more apparent from the following detailed description taken with the accompanying drawings in which.

DESCRITPION OF THE PREFERRED EMBODIMENTS

Figure 1:
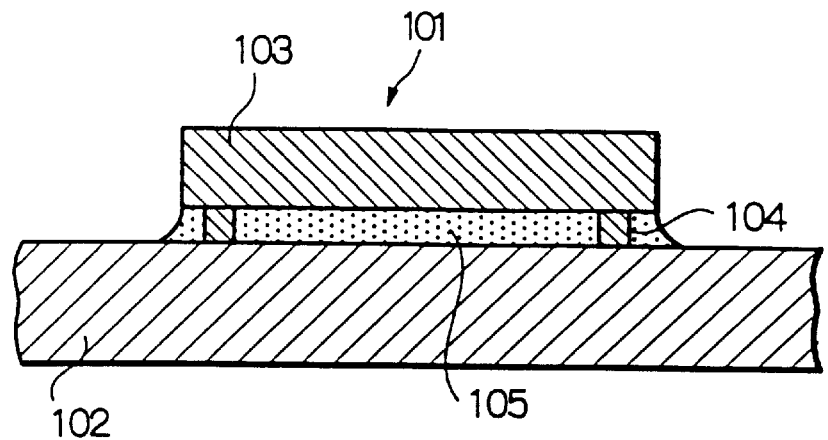
FIG. 1 is a section showing a conventional structure for mounting an electronic part.

To better understand the present invention, brief reference will be made to a conventional structure for mounting an electronic part, shown in FIG. 1. As shown, the structure, generally 101, includes a printed circuit board 102 and a CSP 103 mounted on the surface of the circuit board 102. The circuit board 102 has electrode portions, not shown, connected to the electrode portions, not shown, of the CSP 103 by solder bumps 104. Insulative adhesive 105 fills a gap between the circuit board 102 and the CSP 103.

In the above structure 101, the circuit board 102 and CSP 103 each has a particular coefficient of thermal expansion. Therefore, when temperature in the structure 101 varies, a shearing force acts on the portions of the solder bumps 104 connected to the circuit board 102 and CSP 103. At this instant, the insulative adhesive 105 intervening between the circuit board 102 and the CSP 103 reduces the thermal expansion of the circuit board 102 and CSP 103 and therefore the shearing force acting on the solder bumps 104. This frees the solder bumps 104 from cracks and thereby reduces the defective connection of the circuit board 102 and CSP 103.

However, the above conventional structure 101 has some problems left unsolved, as discussed earlier.

Figure 2:
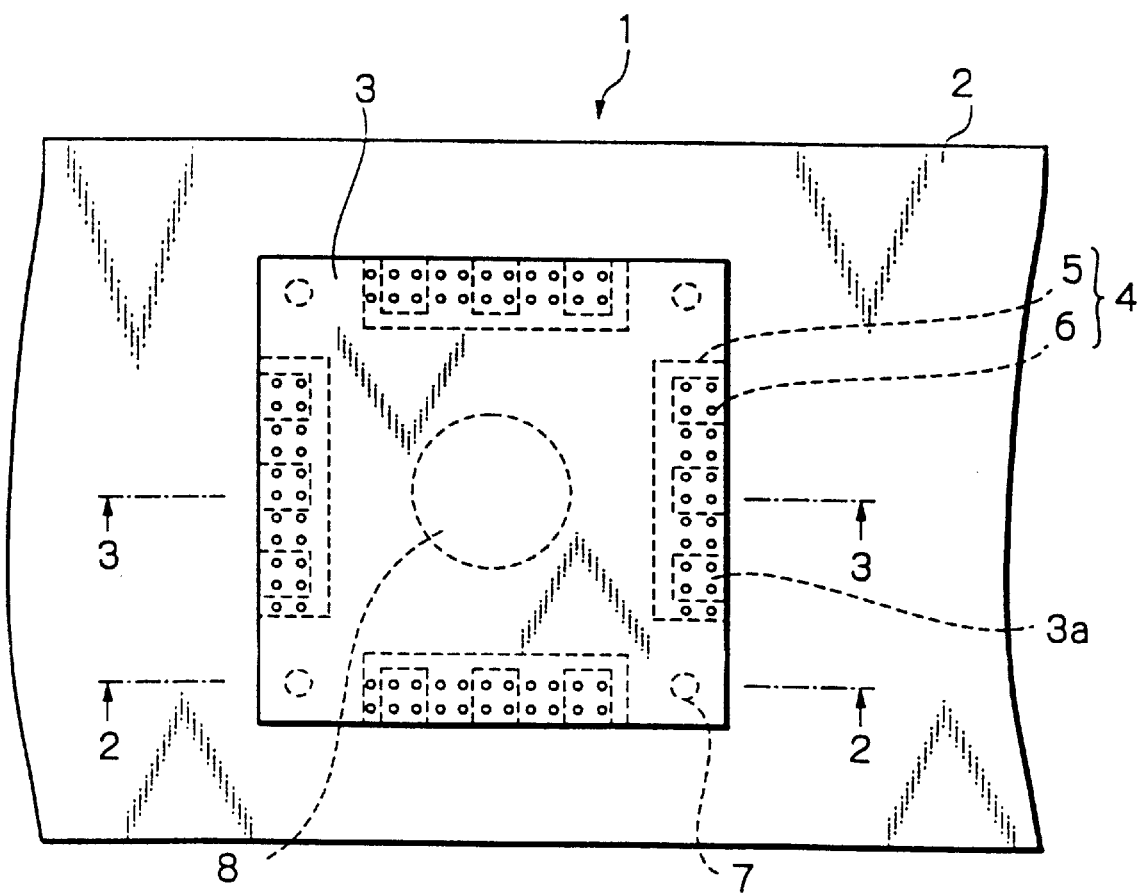
FIG. 2 is a perspective plan view showing a structure for mounting an electronic part embodying the present invention.

Referring to FIG. 2, a structure for mounting an electronic part embodying the present invention will be described. As shown, the structure, generally 1, also includes a printed circuit board 2 and a CSP or electronic part 3 mounted on the surface of the circuit board 2. The circuit board 2 and CSP 3 include electrodes 2a (see FIG. 3) and electrodes 3a, respectively. Anisotropic conductive sheets 4 each is positioned between a particular group of electrodes 2a and a group of electrodes 3a associated therewith.

Figure 3:
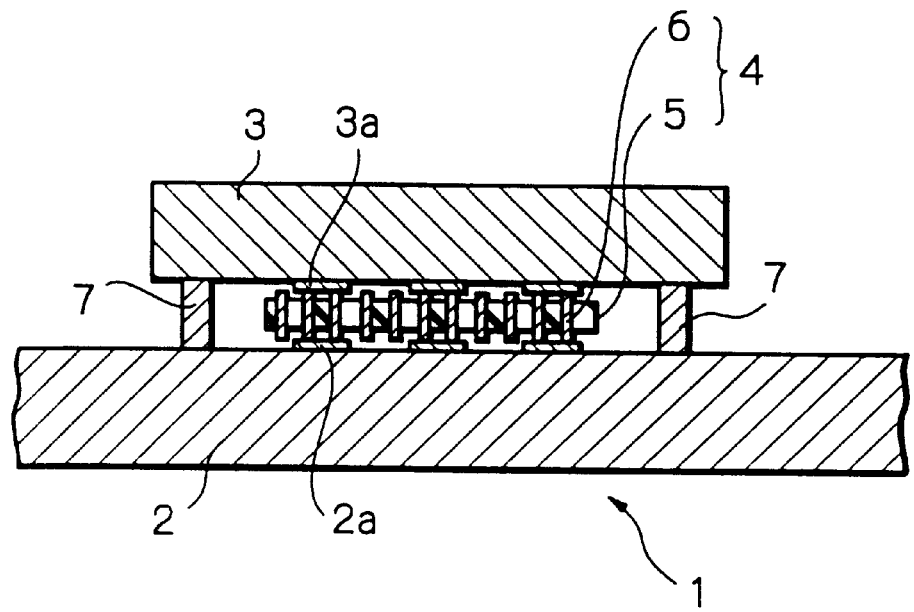
FIGS. 3 and 4 are sections along lines 2—2 and 3—3 of FIG. 2, respectively.

Specifically, each an isotropic conductive sheet 4 is made up of a sheet member 5 formed of silicone rubber or similar insulative rubber, and thin metallic wires or conduction members 6 arranged on the sheet member 5 at preselected intervals. As shown in FIG. 3, the wires 6 protrude from the front and rear of the sheet member 5 and contact the electrodes 2a and electrodes 3a at their tips. The electrodes 2a and electrodes 3a are therefore electrically connected to each other by the wires 6. It is to be noted that the wires 6 initially protrude only from the front of the sheet member 5 by about 15 μm. When the CSP 3 is pressed against the circuit board 2, it causes the wires 6 to protrude from the rear of the sheet member 5 also. As a result, the tips of the wires 6 are brought into contact with the electrodes 2a of the circuit board 2.

Pins or spacers 7 are studded on the four corners of the CSP 3 for guaranteeing a preselected gap between the CSP 3 and the circuit board 2. The CSP 3 is mounted on the circuit board 2 with the pins 7 being pressed against the front of the circuit board 2.

Figure 4:
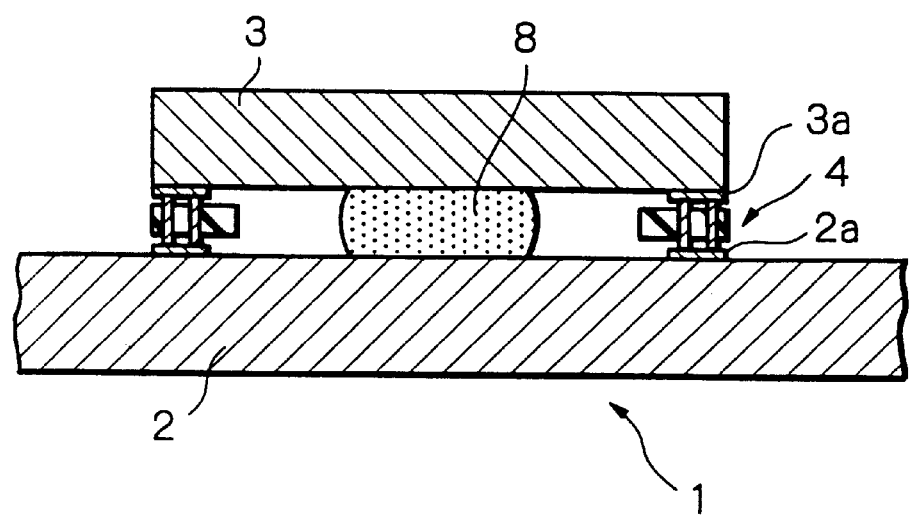

As shown in FIGS. 2 and 4, thermosetting adhesive 8 is applied to the portions of the circuit board 2 and CSP 3 where the electrodes 2a and 3a, respectively, are absent, thereby bonding the circuit board 2 and CSP 3. In the illustrative embodiment, the adhesive 8 is positioned at the center of the CSP 3.

Figure 5A:
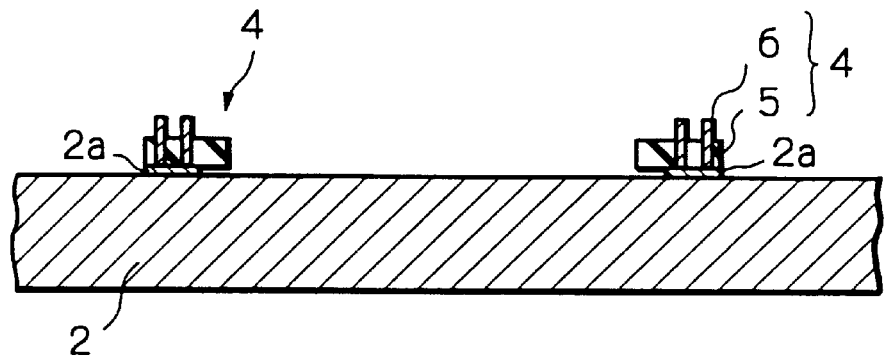
FIGS. 5A–5C are sections demonstrating a mounting procedure particular to the illustrative embodiment.
Figure 5B:
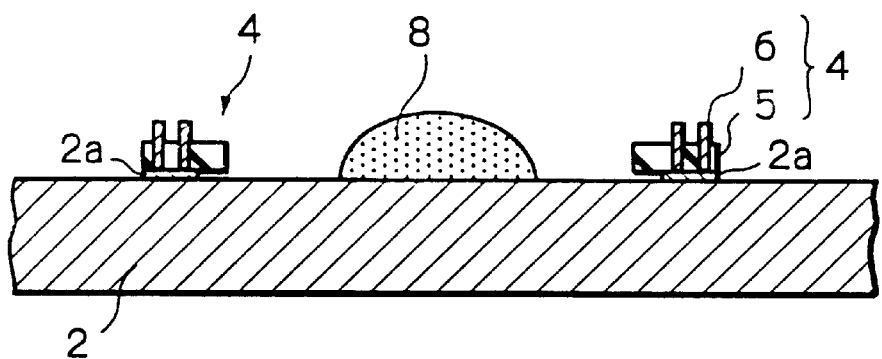

Reference will be made to FIGS. 2–4 for describing a procedure for mounting the CPS 3 to the circuit board 2. First, as shown in FIG. 5A, each anisotropic conductive sheet 4 is laid on the associated electrodes 2a of the circuit board 2. At this instant, the sheet member 5 contacts the electrodes 2a because the wires 6 initially do not protrude from the rear of the sheet members 5, as stated earlier. Generally, silicone rubber or similar rubber has adhesion, so that the sheet members 5 laid on the electrodes 2a are dislocated little and promote rapid mounting. Subsequently, as shown in FIG. 5B, the thermosetting adhesive 8 is applied to the portion of the circuit board 2 where the electrodes 2a are absent.

Figure 5C:
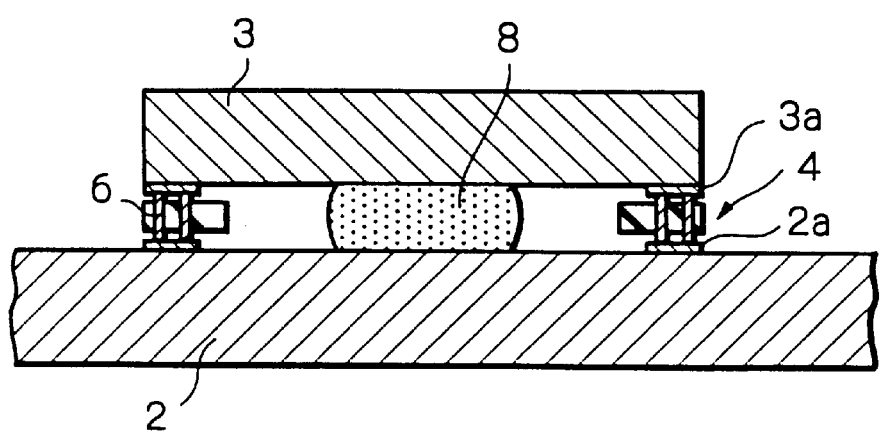

After the electrodes 2a and 3a of the circuit board 2 and CSP 3, respectively, have been aligned with each other, the CSP 3 are mounted to the circuit board 2, as shown in FIG. 5C. Specifically, the CSP 3 is pressed toward the circuit board 2 until the lower ends of the pins 7, FIG. 3, abut against the front of the circuit board 2. As a result, the upper ends of the wires 6 contact the electrodes 3a of the CSP 3. In this condition, the CSP 3 presses the wires 6 downward, as viewed in FIG. 5C, with the result that the lower ends of the wires 6 protrude from the rear of the sheet members 5 and contact the electrodes 2a of the circuit board 2. Consequently, electrical connection is set up between the electrodes 2a and 3a by the wires 6.

Finally, the adhesive 8 is cured by heat with the CSP 3 being pressed against the circuit board 2, completing the mounting structure 1.

As stated above, the electrodes 2a and 3a are connected together by the wires 6 that are simply held between the electrodes 2a and 3a. Further, the electrodes 2a and 3a are not covered with the adhesive 8. It follows that the CSP 3 can be easily replaced only if it is removed from the circuit board 2, and then the adhesive 8 is removed from the circuit board 2 and CSP 3. Because the adhesive 8 is absent at the portions where the electrodes 2a and 3a are arranged, it can be easily removed without damaging the electrodes 2a or 3a.

A new CSP 3 can be mounted to the circuit board 3 only if the anisotropic conductive sheets 4 are laid, and then the adhesive 8 is applied to the circuit board 2. This successfully simplifies the mounting procedure to a significant degree, compared to the conventional procedure needing the steps of forming solder bumps and filling insulative adhesive. Causing adhesive to flow into the small gap between the circuit board and the CSP would introduce bubbles into the adhesive, as discussed earlier.

Moreover, the wires 6 are simply held between the electrodes 2a and 3a. Therefore, despite that the circuit board 2 and CSP 3 are different in the coefficient of thermal expansion from each other, no shearing force acts on the portions of the wires 6 contacting the electrodes 2a and 3a. This is successful to protect the wires 6 from cracks.

In the illustrative embodiment, three electrodes 3a are arranged at each of the four edge portions of the CSP 3. Such a number and arrangement of the electrodes 3a are only illustrative. Also, in the illustrative embodiment, use is made of thermosetting adhesive 8. The thermosetting adhesive 8 may be replaced with UV (Ultra Violet rays) curable adhesive if the circuit board 2 is formed of transparent glass or similar material transparent for light. Of course, a multichip module, for example, may be mounted to the circuit board 2 in place of the CSP 3.

Figure 9:
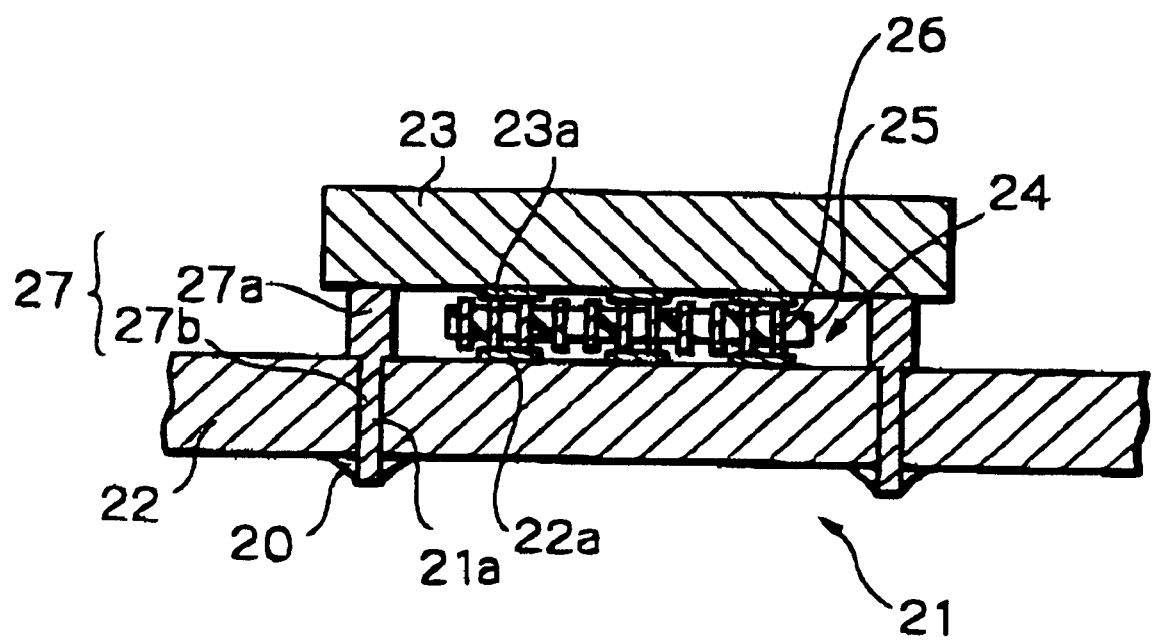
FIG. 9 shows an embodiment of the present invention using hook and notches.

The CSP 3 and circuit board 2 may be respectively formed with hooks 20 and notches 21 of FIG. 9 engageable with each other. The hooks 20 and notches 21 locking the circuit board 2 and CSP 3 to each other, will obviate the need for adhesive or solder and will further facilitate the mounting and dismounting of the CSP 3.

Furthermore, assume that the circuit board 2 is implemented as a flexible circuit board. Then, a reinforcing plate, not shown, may be fitted on the rear of the circuit board 2 in order to prevent the circuit board 2 from deforming when the CSP 3 is mounted thereto. This renders the structure 1 to be practicable even when the circuit board 2 is formed of a soft material.

Figure 6:
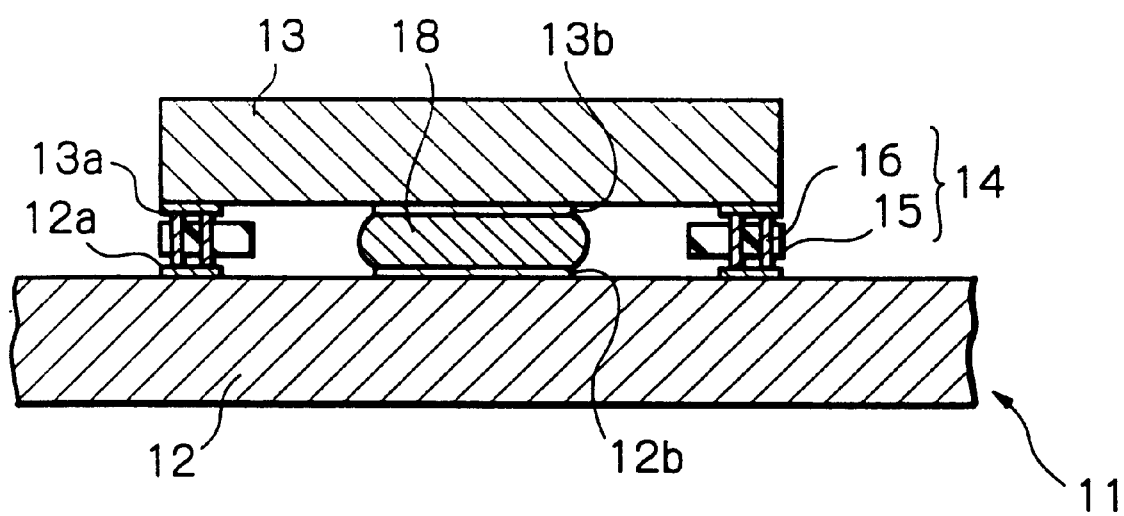
FIG. 6 is a section showing a modification of the illustrative embodiment.

FIG. 6 shows a mounting structure 11 that is a modification of the above embodiment. As shown, a printed circuit board 12 and a CSP 13 are connected together by solder 18 that is a substitute for the adhesive. Solder pads 12b and 13b are respectively formed on the portions of the circuit board 12 and CSP 13 on which the solder 18 is to deposit. The solder pads 12b and 13b are electrically connected also. The structure 11 further includes electrodes 12a provided on the circuit board 12, electrodes 13a provided on the CSP 13, anisotropic conductive sheets 14, silicone rubber sheets 15, thin metallic wires 16, and pins or spacers, not shown, which are configured in exactly the same manner as in the previous embodiment.

In the modified structure 11, the solder pads 12b and 13b and solder 18 implement a power supply line extending from the circuit board 12 to the CSP 13. Such a power supply line has a large diameter and therefore an electric resistance low enough to promote efficient power supply. In addition, solder superior in heat conduction to adhesive promotes heat radiation from the CSP 13.

Figure 7:
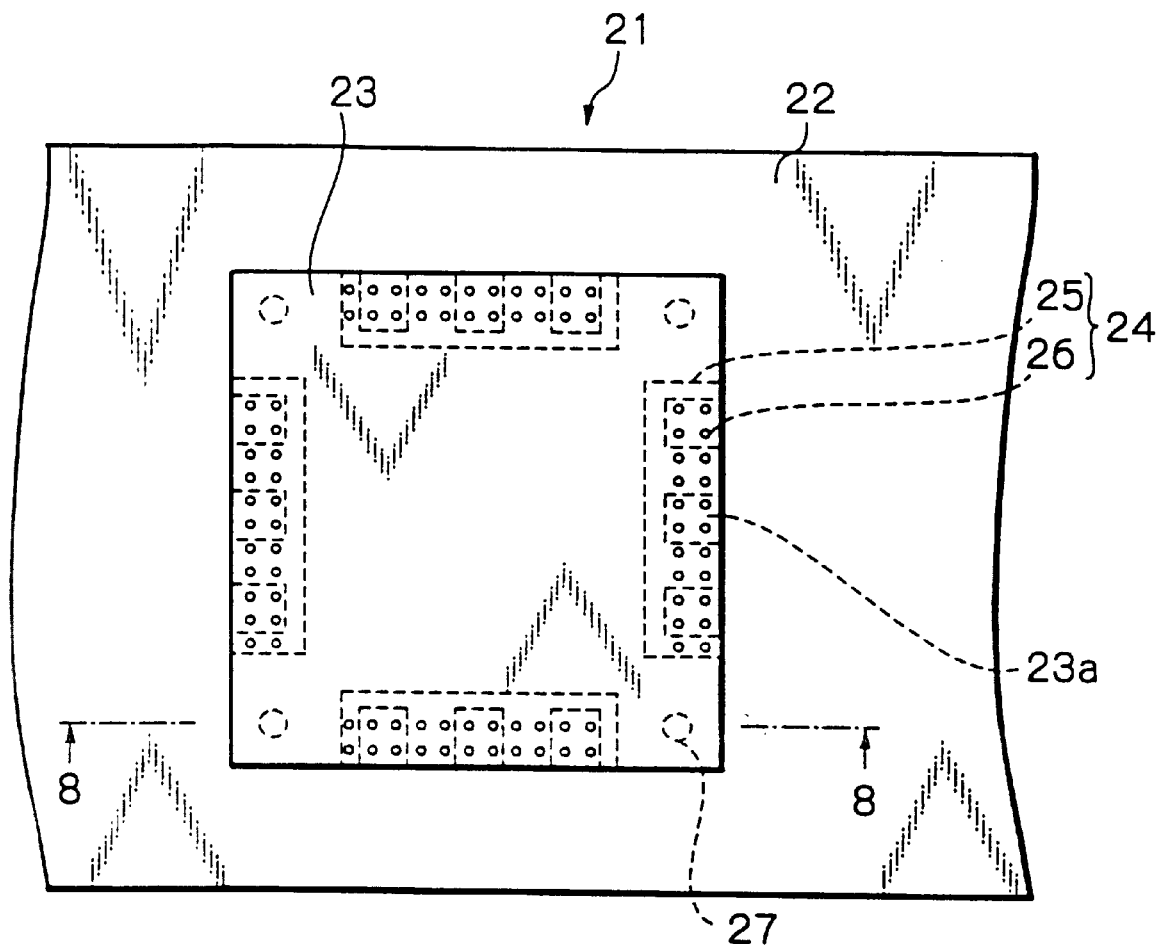
FIG. 7 is a perspective plan view showing an alternative embodiment of the present invention.
Figure 8:
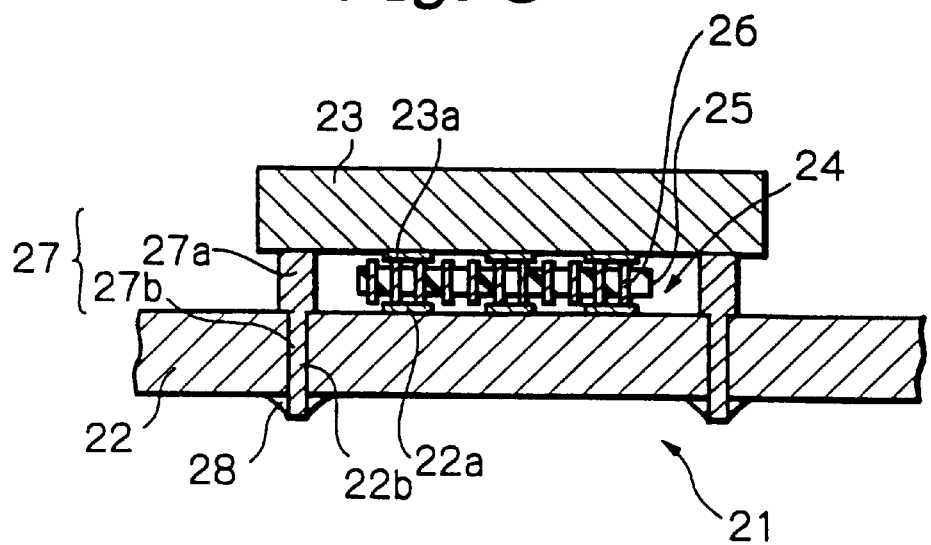
FIG. 8 is a section along line 8—8 of FIG. 7.

An alternative embodiment of the present invention will be described with reference to FIGS. 7 and 8. As shown, a mounting structure, generally 21, includes a printed circuit board 22 and a CSP 23 mounted on the front of the circuit board 22. Anisotropic conductive sheets 24 are held between electrodes 22a provided on the circuit board 22 and electrodes 23a provided on the CSP 23. Specifically, each sheet 24 is made up of a silicone rubber sheet 25 and thin metallic wires or conduction members 26 arranged on the sheet 25 at preselected intervals.

This embodiment differs from the previous embodiment in that adhesive or solder is absent in the gap between the circuit board 22 and the CSP 23. In this embodiment, pins or spacers 27 studded on the CSP 23 each has a larger diameter portion or height determining portion 27a and a smaller diameter portion 27b. The larger diameter portion 27a guarantees a gap of preselected height between the circuit board 22 and the CSP 23. Holes 22b extend throughout the circuit board 22 for receiving the smaller diameter portions of 27b of the pins 27.

The CSP 23 is mounted to the circuit board 22 by being pressed until a shoulder between the larger diameter portion 27a and the smaller diameter portion 27b of each pin 27 abuts against the front of the circuit board 22. In this condition, opposite ends of the wires 26 contact the electrodes 22a and 23a and thereby set up electrical connection therebetween. The smaller diameter portions 27b of the pins 27 protruding form the rear of the circuit board 22 are affixed to the rear of the circuit board 22 by adhesive 28.

In the illustrative embodiment, the adhesive 28 connecting the circuit board 22 and CSP 23 is positioned on the rear of the circuit board 22. The adhesive 28 can therefore be removed more easily than when it is positioned between the circuit board 22 and the CSP 23, facilitating the replacement of the CSP 23. The adhesive 28 connecting the smaller diameter portion 27b of the pins 27 and the circuit board 22 may be replaced with solder, if desired.

Again, when the circuit board 22 is formed of a soft material, a reinforcing plate, not shown, may be fitted on the rear of the circuit board 2 in order to prevent the circuit board 2 from deforming at the time of mounting of the CSP 3. This also renders the structure 21 to be practicable even when the circuit board 22 is implemented as a flexible circuit board.

In summary, in accordance with the present invention, a structure for mounting an electronic part includes conduction members held between electrodes provided on a printed circuit board and electrodes provided on the electronic part in order to electrically connect them together. The conduction members reduce defective connection of the circuit board and electronic part ascribable to a difference in the coefficient of thermal expansion between them. In addition, the electronic part mounted on the circuit board can be easily replaced.

Also, in accordance with the present invention, a method of mounting the electronic part includes the steps of aligning the electrodes of the circuit board and those of the electronic part, laying the conduction members on the electrodes of the circuit board, and affixing the electronic part to the circuit board while pressing the part against the circuit board. The method implements a structure in which the conduction members are simply held between the electrodes of the circuit board and those of the electronic part.

Various modifications will become possible for those skilled in the art after receiving the teachings of the present disclosure without departing from the scope thereof.

What is claimed is:

1. A structure for mounting an electronic part, comprising:
   a printed circuit board formed with electrodes on a front thereof;
   an electronic part to be mounted to the front of said printed circuit board and formed with electrodes to be connected to said electrodes of said printed circuit board;
   conduction members held between said electrodes of said printed circuit board and said electrodes of said electronic part for setting up electrical connection between said electrodes of said printed circuit board and said electronic part, said conduction member comprising thin metallic wires respectively contacting said electrodes of said printed circuit board at one end and contacting said electrodes of said electronic part at the other end; and
   a sheet member, said wires being arranged on said sheet member such that said wires protrude only from a front of said sheet member at one end thereof, the other end of said wires being caused to protrude from a rear of said sheet member when said one end is pressed in a direction perpendicular to the front of said sheet member.

2. A structure as claimed in claim 1, wherein said wires are arranged on a sheet member formed of insulative rubber such that said wires protrude from a front and a rear of said sheet member.

3. A structure as claimed in claim 2, wherein said printed circuit board and said electronic part are affixed to each other by adhesive applied to a portion of said printed circuit board and a portion of said electronic part where said electrodes of said printed circuit board and said electronic part are absent.

4. A structure as claimed in claim 2, wherein pads are respectively formed on a portion of said printed circuit board and a portion of said electronic part where said electrodes of said printed circuit board and said electronic part are absent, said pads being connected to each other by solder to thereby affix said printed circuit board and said electronic part.

5. A structure as claimed in claim 2, further comprising hook-and-notch locking means provided on said printed circuit board and said electronic part for locking said printed circuit board and said electronic part to each other.

6. A structure as claimed in claim 2, further comprising spacing members for forming a gap having a preselected height between said printed circuit board and said electronic part.

7. A structure as claimed in claim 6, wherein said printed circuit board and said electronic part are affixed to each other by adhesive applied to a portion of said printed circuit board and a portion of said electronic part where said electrodes of said printed circuit board and said electronic part are absent.

8. A structure as claimed in claim 1, wherein said sheet member is formed of insulative rubber.

9. A structure as claimed in claim 8, wherein said printed circuit board and said electronic part are affixed to each other by adhesive applied to a portion of said printed circuit board and a portion of said electronic part where said electrodes of said printed circuit board and said electronic part are absent.

10. A structure as claimed in claim 8, wherein pads are respectively formed on a portion of said printed circuit board and a portion of said electronic part where said electrodes of said printed circuit board and said electronic part are absent, said pads being connected to each other by solder to thereby affix said printed circuit board and said electronic part.

11. A structure as claimed in claim 8, further comprising hook-and-notch locking means provided on said printed circuit board and said electronic part for locking said printed circuit board and said electronic part to each other.

12. A structure as claimed in claim 8, further comprising spacing members for forming a gap having a preselected height between said printed circuit board and said electronic part.

13. A structure as claimed in claim 12, wherein said printed circuit board and said electronic part are affixed to each other by adhesive applied to a portion of said printed circuit board and a portion of said electronic part where said electrodes of said printed circuit board and said electronic part are absent.

14. A structure as claimed in claim 1, wherein pads are respectively formed on a portion of said printed circuit board and a portion of said electronic part where said electrodes of said printed circuit board and said electronic part are absent, said pads being connected to each other by solder to thereby affix said printed circuit board and said electronic part.

15. A structure as claimed in claim 1, further comprising spacing members for forming a gap having a preselected height between said printed circuit board and said electronic part.

16. A structure as claimed in claim 15, wherein said printed circuit board and said electronic part are affixed to each other by adhesive applied to a portion of said printed circuit board and a portion of said electronic part where said electrodes of said printed circuit board and said electronic part are absent.

17. A structure as claimed in claim 15, wherein pads are respectively formed on a portion of said printed circuit board and a portion of said electronic part where said electrodes of said printed circuit board and said electronic part are absent, said pads being connected to each other by solder to thereby affix said printed circuit board and said electronic part.

18. A structure as claimed in claim 15, wherein said spacing members each comprises a larger diameter portion for forming the gap having the preselected height and a smaller diameter portion, wherein holes are formed throughout said printed circuit board for respectively receiving the smaller diameter portions of said spacing members, and wherein said smaller diameter portions respectively received in said holes are connected to said printed circuit board by adhesive or solder to thereby affix said printed circuit board and said electronic part.

19. A structure as claimed in claim 15, further comprising hook-and-notch locking means provided on said printed circuit board and said electronic part for locking said printed circuit board and said electronic part to each other.

20. A structure as claimed in claim 1, wherein said printed circuit board and said electronic part are affixed to each other by adhesive applied to a portion of said printed circuit board and a portion of said electronic part where said electrodes of said printed circuit board and said electronic part are absent.

21. A structure as claimed in claim 1, wherein pads are respectively formed on a portion of said printed circuit board and a portion of said electronic part where said electrodes of said printed circuit board and said electronic part are absent, said pads being connected to each other by solder to thereby affix said printed circuit board and said electronic part.

22. A structure as claimed in claim 1, further comprising hook-and-notch locking means provided on said printed circuit board and said electronic part for locking said printed circuit board and said electronic part to each other.

23. A method of mounting an electronic part circuit board, comprising the steps of:
   (a) positioning the printed circuit board formed with electrodes on a front thereof and the electronic part formed with electrodes to be connected to said electrodes of said printed circuit board such that said electrodes of said printed circuit board and said electrodes of said electronic part align with each other;
   (b) positioning a sheet member having wiring protruding from a front surface thereof on said electrodes of said circuit board for electrically connecting said electrodes of said printed circuit board and said electrodes of said electronic part;
   (c) pressing said electronic part against said printed circuit board such that said wires protrude from a rear surface of said sheet member and contact said electrodes of said circuit board when said wires are pressed in a direction perpendicular to the front surface of said sheet member thereby providing electrical connection between the electrodes of said printed circuit board and said electronic part; and
   (d) affixing said electronic part to said printed circuit board while pressing said electronic part against said printed circuit board.

24. A method as claimed in claim 23, wherein said electronic part includes spacing members for forming a gap having a preselected height between said printed circuit board and said electronic part.

25. A method as claimed in claim 24, wherein step (c) comprises pressing said electronic part against said printed circuit board to a position where bottoms of said spacing members contact the front of said printed circuit board.

26. A method as recited in claim 23, further comprising:
   forming a plurality of holes in said printed circuit board;
   placing spacing members for forming a gap having a preselected height between said printed circuit board and said electronic part,
   said spacing members each comprising a larger diameter portion for forming the gap and a smaller diameter portion for fitting in respective holes of said plurality of holes;
   applying adhesive or solder to said smaller diameter portions received in said respective holes to thereby affix said printed circuit board and said electronic part.

27. A structure for mounting an electronic part, comprising:
   a printed circuit board formed with electrodes on a front thereof;
   an electronic part to be mounted to the front of said printed circuit board and formed with electrodes to be connected to said electrodes of said printed circuit board;
   conduction members held between said electrodes of said printed circuit board and said electrodes of said electronic part for setting up electrical connection between said electrodes of said printed circuit board and said electronic part; and
   spacing members for forming a gap having a preselected height between said printed circuit board and said electronic part, said spacing members each comprising a larger diameter portion for forming the gap having the preselected height and a smaller diameter portion, wherein holes are formed throughout said printed circuit board for respectively receiving the smaller diameter portions of said spacing members, and wherein said smaller diameter portions respectively received in said holes are connected to said printed circuit board by adhesive or solder to thereby affix said printed circuit board and said electronic part.

28. A structure as claimed in claim 27, further comprising hook-and-notch locking means provided on said printed circuit board and said electronic part for locking said printed circuit board and said electronic part to each other.

* * * * *